(12) United States Patent
Landaiche

(10) Patent No.: US 6,999,546 B2
(45) Date of Patent: Feb. 14, 2006

(54) SYSTEM AND METHOD FOR TIMING REFERENCES FOR LINE INTERFACES

(75) Inventor: Ken Landaiche, Sebastopol, CA (US)

(73) Assignee: Nokia, inc., Irving, TX (US)

( * ) Notice: Subject to any disclaimer, the term of this patent is extended or adjusted under 35 U.S.C. 154(b) by 990 days.

(21) Appl. No.: 09/751,636

(22) Filed: Dec. 29, 2000

(65) Prior Publication Data

US 2002/0126783 A1 Sep. 12, 2002

(51) Int. Cl.
*H04L 7/00* (2006.01)
(52) U.S. Cl. ............... 375/371; 375/376; 375/354; 327/144; 327/147
(58) Field of Classification Search .......... 375/371, 375/376, 373, 354; 327/141, 144, 147, 152, 327/156
See application file for complete search history.

(56) References Cited

U.S. PATENT DOCUMENTS 5,577,075 A * 11/1996 Cotton et al. ............ 375/356
6,119,016 A * 9/2000 Matusevich ............ 455/502

* cited by examiner

*Primary Examiner*—Temesghen Ghebretinsae
(74) *Attorney, Agent, or Firm*—Darby & Darby P.C.; Bruce E. Black

(57) ABSTRACT

A system (10) and method are provided for phase aligning two timing signals when the timing signals are out of phase. The system (10) includes a selection unit (12) coupled to timing sources (14, 16), a detection means (18, 20) coupled to the selection unit (12) for detecting a failure and causing the selection unit (12) to switch to another timing source, and a unit coupled to the selection unit for phase comparing, wherein the unit introduces gradual phase alterations to the second timing signal until the first and second timing signals are in-phase. The method includes switching to a timing source to provide the time signal when a failure is detected in an existing timing source, comparing the phase of the timing signal to a second timing signal to determine the relative phases of the timing signals, and gradually phase shifting the second timing signal until the timing signals are in-phase

19 Claims, 2 Drawing Sheets

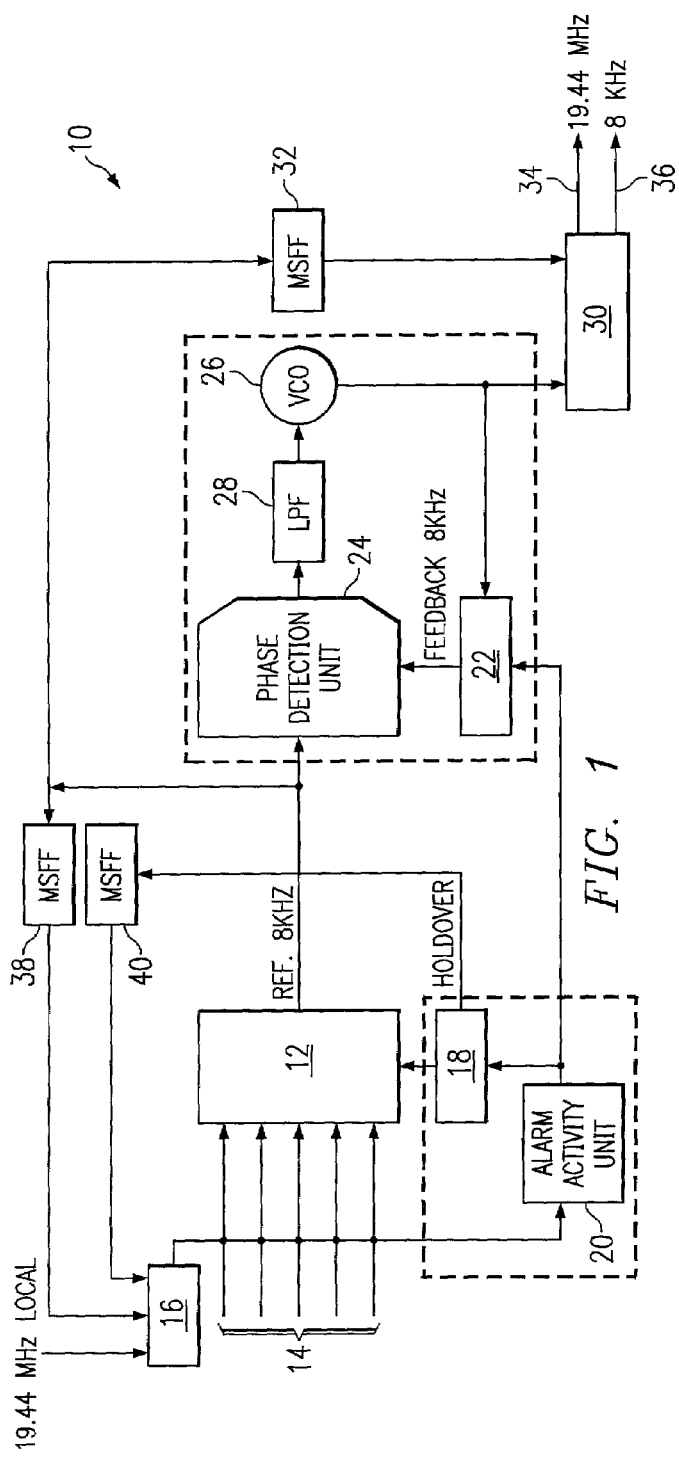
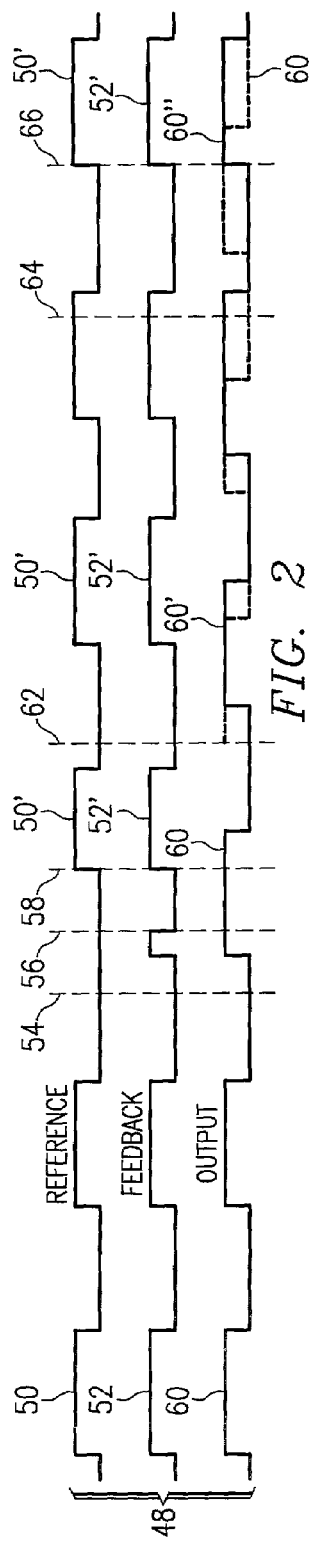
FIG. 1
FIG. 2

SYSTEM AND METHOD FOR TIMING REFERENCES FOR LINE INTERFACES

BACKGROUND

This invention relates to telecommunication systems and, more specifically, to generating timing signals for such systems.

In telecommunication networks or systems, data or a data stream is transported from one location in the network to another location in the network at various data rates. Typically, the data is transported between locations based on some synchronized or timed event. Thus, there is a need to have an accurate timing mechanism that is in phase with other timing sources in the system. Occasionally, the situation arises wherein the timing mechanism fails and the timing signal is lost temporarily. Eventually, the timing signal is restored, however, when the timing device is restored, it is typically not synchronized or in phase with other timing sources.

Known solutions include complex and expensive circuitry to ensure that a timing signal is not lost. Thus, in the event that the source of the timing signal is lost, circuitry acts as the timing source and generates a timing signal so that the system is not subject to phase problems due to lost and later restored timing signals. However, as indicated these solutions are costly and expensive. Additionally, such solutions typically are a temporary solution until the timing source for the timing signal can be restored.

Therefore, what is needed is a system and method for restoring and phase aligning two timing signals in the event that the source for one timing signal is lost temporarily and later restored or switched to another signal.

SUMMARY

A system and method are provided for restoring and phase aligning two timing signals when the source of one timing signal is temporarily lost and the lost timing signal is later restored. The system includes a selection unit coupled to a plurality of timing sources, wherein one time source is being used as a reference and at least one of the timing sources is an internal timing source, a detection means coupled to the selection unit for detecting a failure in the reference timing source and causing the selection unit to switch to another timing source, and a unit coupled to the selection unit for comparing the phase of the other timing source to the phase of the output signal, wherein the unit introduces gradual phase alterations to the second timing signal until the first and second timing signals are in-phase.

The method includes switching to a timing source to provide the time signal when a failure is detected in an existing timing source, comparing the phase of the timing signal to the second timing signal to determine the phase of the timing signal relative to the phase of the second timing signal, and gradually phase shifting the second timing signal until the first timing signal and the second timing signal are in-phase.

BRIEF DESCRIPTION OF THE DRAWINGS

FIG. 1 is a block diagram of system for phase aligning timing signals.

FIG. 2 is a time line representation for phase aligning timing signals for the system of FIG. 1.

DETAILED DESCRIPTION

Figure 3:
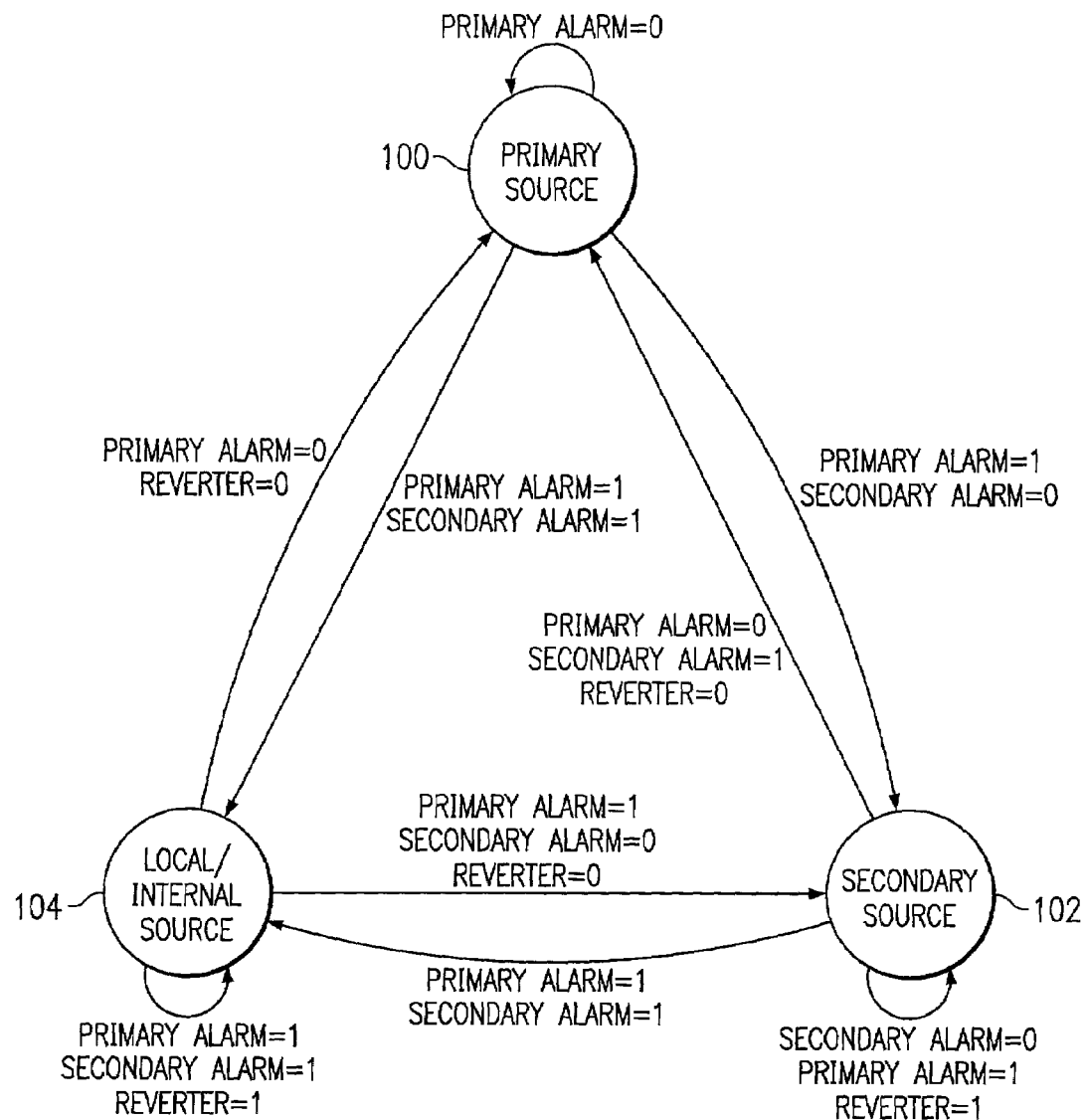
FIG. 3 is a state diagram for the alarm events of the system of FIG. 1.

Referring now to FIG. 1, a system 10 includes a timing reference selector unit 12 coupled to a plurality of external timing sources 14 and an internal timing source 16. The connections shown are intended to show logical connections. In the event that all of the timing signals are lost, which includes at least the primary and secondary signal source 14, then the system 10 switches to use an internal signal generated by the internal timing source 16. The internal timing source 16 generates the 8 kHz reference signal by taking a 19.44 MHz signal and dividing by the value 2430 to get 8 kHz (8,000*2430=19,440,000). However, when a timing source fails and a replacement timing source is activated the timing signal will be out of phase with respect to other timing signals in the system 10, and hence, the timing signals will have to be phase aligned.

The selector unit 12 is coupled to a control unit 18, which provides input to the selector unit 12 to select another reference source to replace the failed timing source. The control unit 18 receives alarm conditions from an alarm activity unit 20. The control unit 18 provides input to the selector unit 12 based on the alarm conditions detected and reported by the activity unit 20 to the control unit 18. Accordingly, the selector unit 12 selects another timing source to generate the reference signal, which will be out of phase with the output signal once the reference signal is restored.

The alarm condition detected by the activity unit 20 is an indication of whether the current timing source is working properly or has failed. In the event that the alarm condition indicates that the current timing source has failed, then the alarm condition information that is passed to the control unit 18 is used by the control unit 18 to determine if the selector unit 12 needs to switch to another timing source.

The activity unit 20 also sends the alarm conditions to a unit 22. The unit 22 is coupled to a phase detection unit 24 and a Voltage Control Oscillator (VCO) 26. The phase detection unit 24 is coupled to a low-pass filter (LPF) unit 28, which is coupled to the VCO 26. Thus, the unit 22, phase detection unit 24, the LPF unit 28, and the VCO 26 form a feedback loop unit, which is discussed in detail below. The VCO 26 is also coupled to a generator unit 30. The unit 30 receives the output signal from the VCO 26 to generate and output a signal 34 at 19.44 MHz and a signal 36 at 8 kHz. The unit 30 is coupled to a metastability flip-flop (MSFF) unit 32, which is coupled to and receives a reference signal from the selector unit 12. Using the reference signal, the MSFF unit 32 produces and outputs a signal to the unit 30. Additionally, the selector unit 12 is coupled to the MSFF unit 38 and the control unit 18 is coupled to the MSFF unit 40. Each of the MSFF units 38 and 40 output signals to the internal timing source unit 16.

The signal emerging from the VCO 26 is received from the detection unit 24 and is the signal that is used to generate the output signals 34 and 36. Thus, the phase of the reference signal sent from the selector unit 12 to the detection unit 24 must correspond to the phase of the output signals, such as the signal 36. More specifically, the reference signal of the system 10 must be synchronized with the output signal 36.

The signal received by the unit 22 from the VCO 26 is sent to the detection unit 24 for phase detection. The detection unit 24 compares the phase of the output signal received from the unit 22 to the phase of the reference signal received from the selector unit 12. Based on the relative phases of the two signals, the detection unit 24 in conjunction with the unit 22 either advance or retard the phase of the output signal until the phase of the output signal is aligned with the phase of the reference signal. The alteration in the phase of the output signal is done gradually to avoid any problems in the system 10, or the network, that are caused by sudden phase shifts or changes; this phase alteration is achieved over a number of cycles virtually undetected by the system 10.

Referring now to FIG. 1 and FIG. 2, FIG. 2 shows a time line 48 with a reference signal 52, which is outputted from the selection unit 12 to the detection unit 24, initially in-phase with a feedback signal 52 form the unit 22 to the detection unit 24 and an output signal 60. At a time 54 there is a loss of the timing source and, hence, the reference signal 50 is lost. Consequently, a lost signal alarm condition is created and the control unit 18 causes the selection unit 12 to switch to another reference source.

At a time 56 the feedback signal 52 is reset to produce a reset feedback signal 52' that is in-phase, at time 58, with a restored reference signal 50'. However, the signal 60 is now out-of-phase with the reference signal 50'. In order to phase shift the output signal, incremental and small phase shifts are gradually introduced, at a time 62 and 64, to the signal 60 to produce output signals 60' and 60" at times 62 and 64, respectively. The original signal 60 is shown in broken line and the output signal 60" is in-phase at a time 66 with the reference signal 50'.

Referring now to FIG. 3, a state diagram is shown for the activity unit 20 working in conjunction with the control unit 18, wherein a "zero" represents no alarm condition and a "one" represents a triggered alarm. At state 100 the primary timing signal feed into the selector unit 12, FIG. 1, is used as long as the primary-alarm is zero. If the primary-alarm becomes one and a secondary-alarm is zero, then the system operates at state 102, where the secondary timing source is used. On the other hand, if the primary-alarm becomes one and the secondary-alarm is one, then the system goes to state 104.

With the system at state 102, if the secondary-alarm becomes one and the primary-alarm is back to zero, then the system operates at state 100 again.

On the other hand, while the system is at state 102 if both the secondary-alarm and the primary-alarm are one, then the system operates at state 104.

At state 104 the local or internal timing reference is used because the alarm conditions indicate that all external timing references are unavailable. In this example only two external timing references are shown; however, the scope of the invention as set forth herein is not limited thereby because there may be any number of external timing source, including only one source. If the secondary-alarm returns to zero while the system is at state 104 and the primary-alarm is one, then the system returns to operate at state 102, provided the revert-condition is zero. If the system is at state 104 and the primary-alarm becomes zero and the revert-condition is zero, then the system goes to state 100. Thus, the system can operate or use any timing source depending on the alarm conditions associated with those sources.

It is to be understood that the foregoing description is intended to illustrate and not limit the scope of the invention, which is defined by the scope of the appended claims. Other aspects, advantages, and modifications are within the scope of the following claims. Although described in the context of particular embodiments, it will be apparent to those skilled in the art that a number of modifications to these teachings may occur. Thus, while the invention has been particularly shown and described with respect to one or more preferred embodiments thereof, it will be understood by those skilled in the art that certain modifications or changes, in form and shape, may be made therein without departing from the scope and spirit of the invention as set forth above and claimed hereafter.

What is claimed is:

1. A system for phase aligning a first timing signal with a second timing signal, the system comprising:
   a selection unit coupled to a plurality of timing sources, wherein one timing source is being used as a reference to produce the first timing signal and at least one timing source is an internal timing source;
   a detection unit coupled to the selection unit for detecting a failure in the reference timing source of the first timing signal and causing the selection unit to switch to a second timing source to continue generating the first timing signal;
   a unit coupled to the selection unit for comparing the phase of the first timing signal after switching to the second timing source to the phase of the second timing signal, wherein the unit introduces gradual phase alterations to the second timing signal until the first and second timing signals are in-phase, and wherein the unit provides a feedback signal that is in phase with the first timing signal before failure of the reference timing source and is reset, prior to the first and second timing signals being in-phase, to be in phase with the first timing signal from the second timing source after failure of the reference timing source.

2. The system of claim 1, wherein the detection unit comprises:
   an alarm activity unit coupled to the timing sources for detecting a failure in any one of the timing sources; and
   a control unit coupled to the alarm unit and the selection unit for determining and instructing the selection unit to switch to another timing source.

3. The system of claim 1, further comprising an internal timing unit coupled to the selection unit for providing the internal timing source.

4. The system of claim 1, wherein the unit comprises:
   a phase detection unit coupled to the selection unit for comparing the phase of the first timing signal to the phase of the second timing signal;
   a phase adjuster unit coupled to the phase detection unit for providing a feedback timing signal that indicates a gradual phase shift of the second timing signal to the phase detection unit and continues the gradual phase shift as long as the first timing signal and the second timing signal are detected as being out of phase by the phase detection unit;
   a low pass filter coupled to the phase detection unit for filtering the output timing signal from the phase detector unit; and
   an oscillator coupled to the low pass filter and the phase adjuster unit for providing the feedback timing signal.

5. The system of claim 3, further comprising a flip-flop disposed between the selection unit and the internal timing unit to provide a signal from the selection unit to the internal timing unit.

6. The system of claim 3, further comprising a flip-flop disposed between the detection unit and the internal timing unit to provide a signal from the detection unit to the internal timing unit.

7. The system of claim 1, wherein the first timing signal has a frequency of 8 kHz.

8. The system of claim 1, further comprising a generator unit coupled to the unit to receive the first timing signal and generate at least one output signal.

9. The system of claim 8, further comprising a flip-flop disposed between the selection unit and the generator unit to provide a signal from the selection unit to the generator unit.

10. A method for phase aligning a first timing signal with a second timing signal, the system comprising:
   generating a feedback signal in-phase with the first timing signal;
   switching to a second timing source to provide the first timing signal when a failure is detected in an existing timing source;
   reseting the feedback signal, after failure of the existing timing source, to be in-phase with the first timing signal of the second timing source;
   comparing the phase of the first timing signal to the second timing signal to determine the relative phase of the first timing signal to the second timing signal; and
   gradually phase shifting the second timing signal until the first timing signal and the second timing signal are in-phase by introducing incremental phase changes to the second timing signal over a plurality of cycles, wherein the feedback signal is reset to the first timing signal prior to the first timing signal and the second timing signal being shifted in-phase.

11. A system for phase aligning a first timing signal with a second timing signal, the system comprising:
   a selection unit coupled to a plurality of timing sources, wherein one timing source is being used as a reference to produce a first timing signal;
   a detection unit coupled to the selection unit for detecting a failure in the reference timing source and causing the selection unit to switch to a second timing source to continue generating the first timing signal;
   a feedback loop unit coupled to the selection unit for comparing the phase of the first timing signal after switching to the second timing source to the phase of the second timing signal, wherein the unit is arranged to receive a signal from the detection unit after failure of the first timing signal.

12. The system of claim 11, wherein the detection unit comprises:
   an alarm activity unit coupled to the timing sources for detecting a failure in any one of the timing sources; and
   a control unit coupled to the alarm unit and the selection unit for determining and instructing the selection unit to switch to another timing source.

13. The system of claim 11, wherein at least one timing source is an internal timing source.

14. The system of claim 13, further comprising an internal timing unit coupled to the selection unit for providing the internal timing source.

15. The system of claim 14, further comprising a flip-flop disposed between the detection unit and the internal timing unit to provide a signal from the detection unit to the internal timing unit.

16. The system of claim 11, wherein the feedback loop unit comprises:
   a phase detection unit coupled to the selection unit for comparing the phase of the first timing signal to the phase of the second timing signal;
   a phase adjuster unit coupled to the phase detection unit for providing a feedback timing signal that indicates a gradual phase shift of the second timing signal to the phase detection unit and continues the gradual phase shift as long as the first timing signal and the second timing signal are detected as being out of phase by the phase detection unit;
   a low pass filter coupled to the phase detection unit for filtering the output timing signal from the phase detector unit; and
   an oscillator coupled to the low pass filter and the phase adjuster unit for providing the feedback timing signal.

17. The system of claim 11, wherein the first timing signal has a frequency of 8 kHz.

18. The system of claim 11, further comprising a generator unit coupled to the feedback loop unit to receive the first timing signal and generate at least one output signal.

19. The system of claim 18, further comprising a flip-flop disposed between the selection unit and the generator unit to provide a signal from the selection unit to the generator unit.

* * * * *

UNITED STATES PATENT AND TRADEMARK OFFICE
CERTIFICATE OF CORRECTION

| | | |
|---|---|---|
| PATENT NO. | : 6,999,546 B2 | Page 1 of 2 |
| APPLICATION NO. | : 09/751636 | |
| DATED | : February 14, 2006 | |
| INVENTOR(S) | : Ken Landaiche | |

It is certified that error appears in the above-identified patent and that said Letters Patent is hereby corrected as shown below:

Title Page, Item (73) Assignee:

Please delete "Nokia, inc., Irving, TX (US)" and substitute with

-- Nokia, Inc., Irving, TX --.

Title Page Col. 2 (Abstract), Line 16, After "in-phase" insert --.--.

Sheet 1 of 2 (Besides Box. 12) (Fig. 1), Line 1, After "REF." delete "8KHZ" and insert -- 8 kHz --.

Sheet 1 of 2 (Above Box. 22) (FIG. 1), Line 1, After "FEEDBACK" delete "8KHz" and insert -- 8 kHz --.

Column 1, Line 19, After "with" insert -- the --.

Column 2, Line 39, Delete "low-pass" and insert -- low pass --.

Column 3, Line 20, Delete "out-of-phase" and insert -- out of phase --.

UNITED STATES PATENT AND TRADEMARK OFFICE
CERTIFICATE OF CORRECTION

PATENT NO. : 6,999,546 B2
APPLICATION NO. : 09/751636
DATED : February 14, 2006
INVENTOR(S) : Ken Landaiche It is certified that error appears in the above-identified patent and that said Letters Patent is hereby corrected as shown below:

Column 5, Line 11, In Claim 10, delete "reseting" and insert -- resetting --.

Signed and Sealed this

Second Day of October, 2007

JON W. DUDAS
*Director of the United States Patent and Trademark Office*